(12) United States Patent
Barber et al.

(10) Patent No.: US 7,016,054 B2
(45) Date of Patent: Mar. 21, 2006

(54) LITHOGRAPHY LINE WIDTH MONITOR REFLECTING CHIP-WIDE AVERAGE FEATURE SIZE

(75) Inventors: Duane B. Barber, Camas, WA (US); Robert C. Muller, Portland, OR (US); Mark C. Simmons, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 219 days.

(21) Appl. No.: 10/403,611

(22) Filed: Mar. 31, 2003

(65) Prior Publication Data

US 2004/0190007 A1 Sep. 30, 2004

(51) Int. Cl.
*G01B 11/02* (2006.01)
(52) U.S. Cl. .................................................... 356/636
(58) Field of Classification Search ................ 356/625, 356/636, 237.4, 237.5; 430/30
See application file for complete search history.

(56) References Cited

U.S. PATENT DOCUMENTS

| 4,963,924 A | * | 10/1990 | Gill et al. .................... 356/636 |
| 6,215,127 B1 | * | 4/2001 | Yu .......................... 250/492.1 |
| 6,742,168 B1 | * | 5/2004 | Nariman ....................... 716/4 |

* cited by examiner

*Primary Examiner*—Richard A. Rosenberger
(74) *Attorney, Agent, or Firm*—Trexler, Bushnell, Giangiorgi, Blackstone & Marr, Ltd.

(57) ABSTRACT

The invention provides a method of measuring a standard critical dimension feature and insuring that this feature is representative of cross-chip average critical dimension size in accordance with an embodiment of the invention. The method includes the steps of incorporating a cluster of CD features, determining a cross-chip average feature size, selecting the CD feature which is closest in size to the cross-chip average CD feature size as the standard feature for in-line measurement, and implementing the CD measurement of the appropriate feature on production wafers.

13 Claims, 6 Drawing Sheets

LITHOGRAPHY LINE WIDTH MONITOR REFLECTING CHIP-WIDE AVERAGE FEATURE SIZE

BACKGROUND OF THE INVENTION

The present invention generally pertains to the fields of reticle technology, photolithography, and metrology. More specifically, the present invention relates to an efficient means of measuring a standard critical dimension feature and insuring that this feature is representative of cross-chip average critical dimension size.

There is a need to make in-line measurements of feature sizes which are both efficient in measurement execution and simultaneously representative of feature sizes across an entire chip. If the in-line measurement is not representative of the average feature size, then an in-line monitor may indicate that a wafer is right on target, but when the wafer reaches end-of-line testing, the electrical parameters, incorporating all features within the chip, may be found to be shifted away from target. There are a number of existing approaches which attempt to solve this problem, but each of these approaches are lacking in one or more respects.

One existing approach to solve this problem is to measure a standard critical dimension ("CD") feature at a small number of points across a wafer. This approach or method is the industry standard. It works very well if the standard CD feature is the same size as the cross-chip average CD size. However, if the standard CD feature does not match the cross-chip average, then bringing the standard CD feature onto target will result in the cross-chip average CD being off of target.

A second existing approach to solve this problem is to measure a standard CD feature at a small number of points across a wafer, but target this feature such that the cross-chip average feature size is on target. For example, if the standard CD feature is ten (10) nanometers larger than the cross-chip average feature size, then adjust the dose such that the standard CD feature ends up ten (10) nanometers above target, so that the cross-chip average feature size ends up right on target. This approach or method results in efficient measurements and also results in cross-chip average CD values on target. However, it is typically impractical to implement because each reticle has the potential to require a different CD target. This makes it very cumbersome to determine if a given measurement is within specified limits or not, since the specified limits may be unique for that reticle rather than a global for a given technology. It also hinders statistical process control, since different CD targets may result in a control chart with data points jumping up and down, appearing out of control but in reality simply reflecting a wide range of CD targets.

A third existing approach or method to solve this problem is to search within the chip for a feature which happens to be at the cross-chip average feature size. This feature is then measured at a small number of points across the wafer. This technique results in cross-chip CD values being on target. However, it means that each reticle will need to have a different feature measured at the metrology step. This will considerably slow the metrology set-up as the suitable feature is located. The non-standard CD feature will also make it very difficult to determine if a measurement is incorrect due to the metrology tool measuring the wrong feature, since it is much harder to distinguish correct features from incorrect features when even the correct features are non-standard.

A fourth existing approach or method to solve this problem is to measure a large number of features within a chip and then repeat this for a small number of chips across a wafer. This method yields cross-chip average CD values on target. However, it is highly inefficient for the metrology process, and severely restricts the metrology throughput.

The learning curves for any of the four aforementioned approaches or methods may be shortened by first measuring the specified features for that approach on the photomask rather than on the wafer. The results can then be used to predict the correct exposure does through a calibration curve comparing photomask feature size to applied dose and wafer feature size for previous photomasks or for a reference photomask with multiple feature sizes. This option thus pre-compensates the dose for the photomask-to-wafer size bias, improving the chances that the first wafer printed will be on target and will not need to be reworked. While this method does reduce the likelihood that the first wafer printed will be off-target, it does not change any of the negative aspects of the four above-identified approaches as they relate to in-line monitoring of production wafers. The following issues still impact these approaches: having a standard CD feature which is sized differently than the cross-chip average feature size; impractical targeting requirements; metrology recipes which are slow to set up and unreliable in execution; and an excessive number of measurements on production wafers.

Therefore, an improved method of making in-line measurements of feature sizes, which is both efficient in measurement execution and simultaneously representative of feature sizes across an entire chip is needed. The present invention provides such a method. Features and advantages of the present invention will become apparent upon a reading of the attached specification, in combination with a study of the drawings.

OBJECTS AND SUMMARY OF THE INVENTION

A primary object of an embodiment of the invention is to provide a method of making in-line measurements of feature sizes which are both efficient in measurement execution and simultaneously representative of feature sizes across an entire chip.

An object of an embodiment of the invention is to provide a method of making in-line measurements which does not make it very cumbersome to determine if a given measurement is within spec limits, since the spec limits may be unique for a certain reticle rather than global for a given technology.

An object of an embodiment of the invention is to provide a method of making in-line measurements that does not hinder statistical process control.

Another object of an embodiment of the invention is to provide a method of making in-line measurements that does not slow the metrology set-up.

Yet another object of an embodiment of the invention is to provide a method of making in-line measurements that is not highly inefficient for the metrology process and which does not severely restrict the metrology throughput.

Still another object of an embodiment of the invention is to provide a method of making in-line measurements which uses clear and unique labels for each feature with the critical dimension feature cluster making it easy for metrology personnel to select the appropriate feature when setting up the automated metrology job.

Another object of an embodiment of the invention is to provide a method of making in-line measurements which uses labels that make pattern recognition easy for the metrology tool, so that during automated measurements there is no risk of the metrology tool accidentally jumping to measure the wrong feature.

Yet another object of an embodiment of the present invention is to provide a method of making in-line measurements which provides increased tolerance for targeting such that the method potentially doubles the traditional article reticle specification tolerance.

Another object of an embodiment of the present invention is to provide a method of making in-line measurements which results in cost savings and improved cycle time for wafer production as fewer reticles will be rejected for out of specification critical dimensions.

Briefly, and in accordance with at least one of the foregoing, an embodiment of the present invention provides a method of measuring a standard critical dimension feature and insuring that this feature is representative of cross-chip average critical dimension size in accordance with an embodiment of the invention. The method includes four steps. The first step is to incorporate a cluster of CD features. The second step is to determine a cross-chip average feature size. The second step can be performed in one of three ways. The first way is to print a wafer using a mask, measure all standard CD features within the CD feature cluster, and drive around within the chip and measure a very large number of features in order to determine the cross-chip average size. The second way is to use a reticle inspection tool to measure all standard CD features within the CD feature cluster, and drive around within the chip and measure a very large number of features in order to determine cross-chip average feature size. The third way is to drive to the CD feature cluster, measure each of the CD features, step across the active area of the reticle and take one-hundred (100) to nine-hundred (900) measurements, and calculate the average chip CD and range. The third step is to select the CD feature which is closest in size to the cross-chip average CD feature size as the standard feature for in-line measurement. The fourth step is to implement the CD measurement of the appropriate feature on production wafers.

BRIEF DESCRIPTION OF THE DRAWINGS

The features of the present invention which are believed to be novel, are described in detail herein below. The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE ILLUSTRATED EMBODIMENT

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

The invention provides an efficient method of measuring a standard critical dimension ("CD") feature and insuring that this feature is representative of cross-chip average CD size. This method is illustrated in FIG. 1 and is represented by reference numeral 100.

Figure 1:
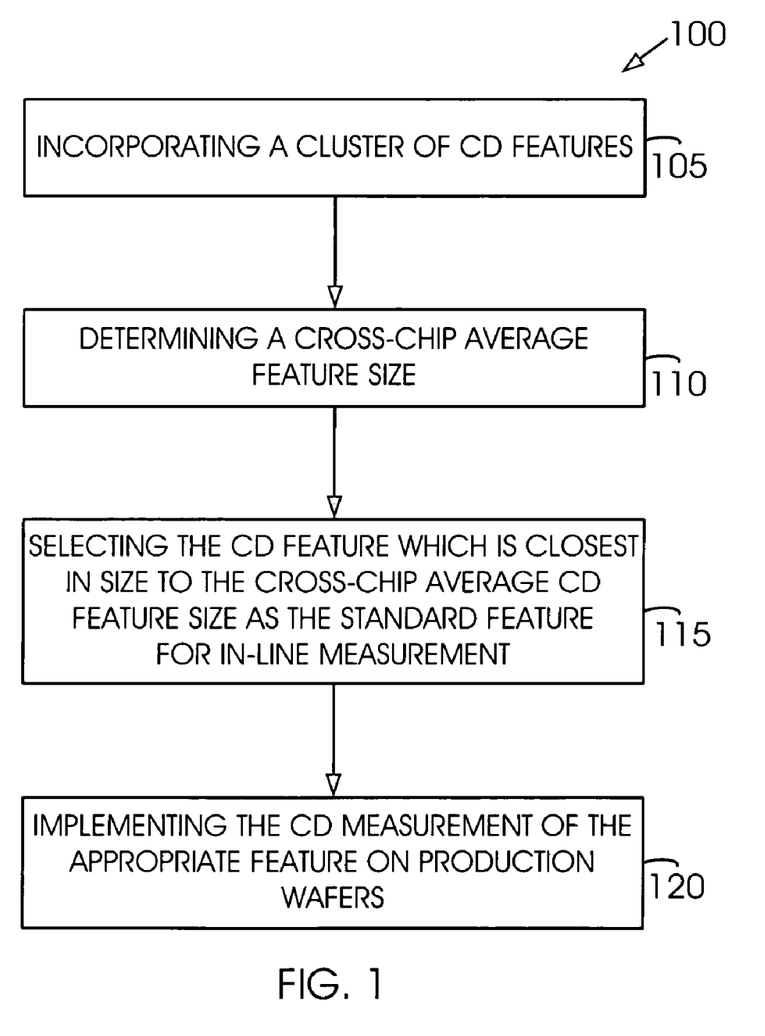
FIG. 1 is a flow chart illustrating a method of measuring a standard critical dimension feature and insuring that this feature is representative of cross-chip average critical dimension size in accordance with an embodiment of the invention.
Figure 2:
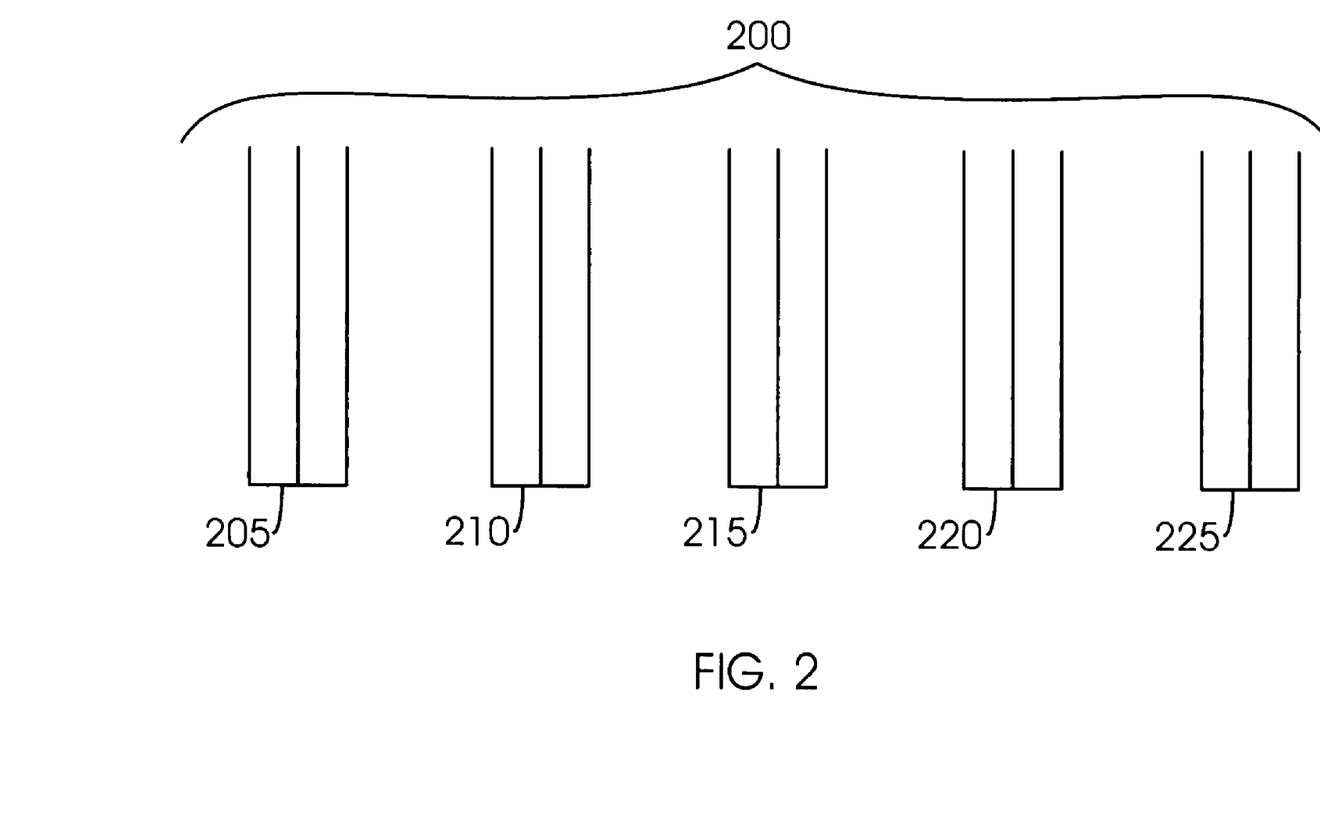
FIG. 2 is a side-elevational view of a critical dimension cluster containing multiple individual critical dimension features in accordance with an embodiment of the invention.

The first step of method 100, which is generally represented by reference numeral 105 in FIG. 1, is to incorporate a cluster of CD features. FIG. 2 illustrates a cluster 200 of individual CD features 205, 210, 215, 220, 225. Each CD feature 205, 210, 215, 220, 225 is clearly and uniquely labeled. Each of the CD features 205, 210, 215, 220, 225 are identical to one another except for being specified in a photomask data file at a slightly different size. Because each of the CD features 205, 210, 215, 220, 225 are specified in a photomask data file, each of the CD features 205, 210, 215, 220, 225 are therefore printed on the mask. In FIG. 2, the individual CD features 205, 210, 215, 220, 225 are illustrated as "tuning fork" structures. A useful configuration would be to draw one of these CD features 205, 210, 215, 220, 225 at the target size, with the other CD features 205, 210, 215, 220, 225 being spread out in size above and below the target size. For example, if the target size is two-hundred (200) nanometers, the CD features shown in FIG. 2 could be sized as follows: CD feature 205 being one-hundred ninety (190) nanometers; CD feature 210 being one-hundred ninety-five (195) nanometers; CD feature 215 being two-hundred (200) nanometers; CD feature 220 being two-hundred five (205) nanometers; and CD feature 225 being two-hundred ten (210) nanometers.

Figure 3:
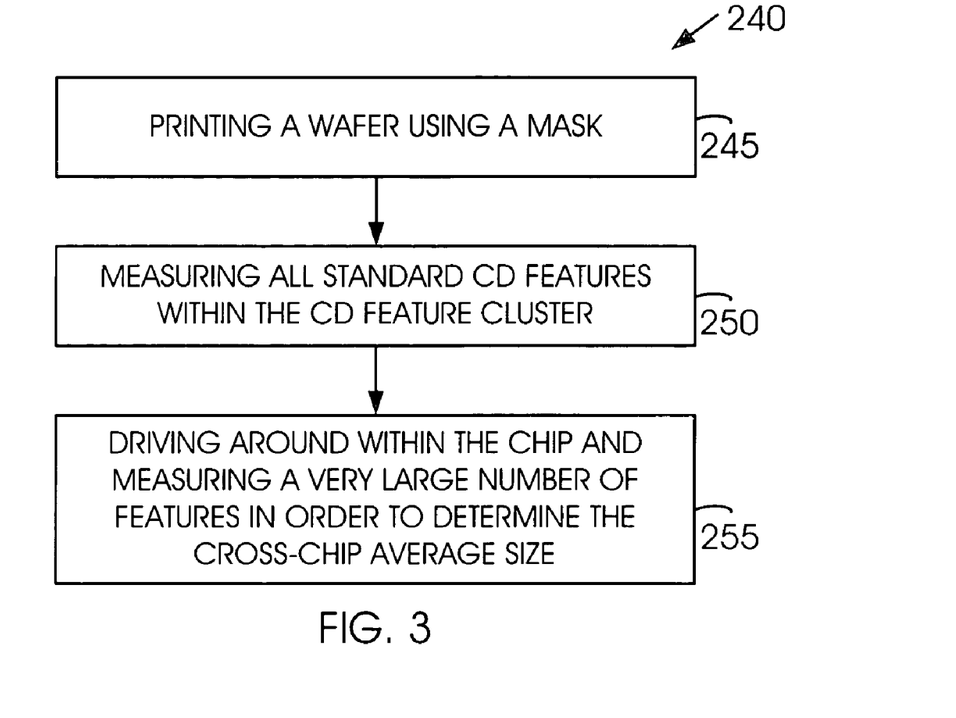
FIG. 3 is a flow chart illustrating a first method of determining a cross-chip average feature size in accordance with an embodiment of the invention.

The second step of method 100, which is generally represented by reference numeral 110 in FIG. 1, is to determine a cross-chip average feature size. The second step 110 of method 100 can be performed using the method 240 illustrated in FIG. 3. Method 240 begins with the first step 245, which is to print a wafer using the mask. The second step 250 is to measure all standard CD features 205, 210, 215, 220, 225 within the CD feature cluster 200. The third step 255 is to drive around within the chip and measure a very large number of features in order to determine the cross-chip average feature size. The method 240, however, involves considerable human time and metrology time, impeding throughput on the production line. The method 240 also incorporates any localized variations in the lithography process (or even the etch process, depending on the stage at which the wafer is measured), which may vary from wafer to wafer.

Figure 4:
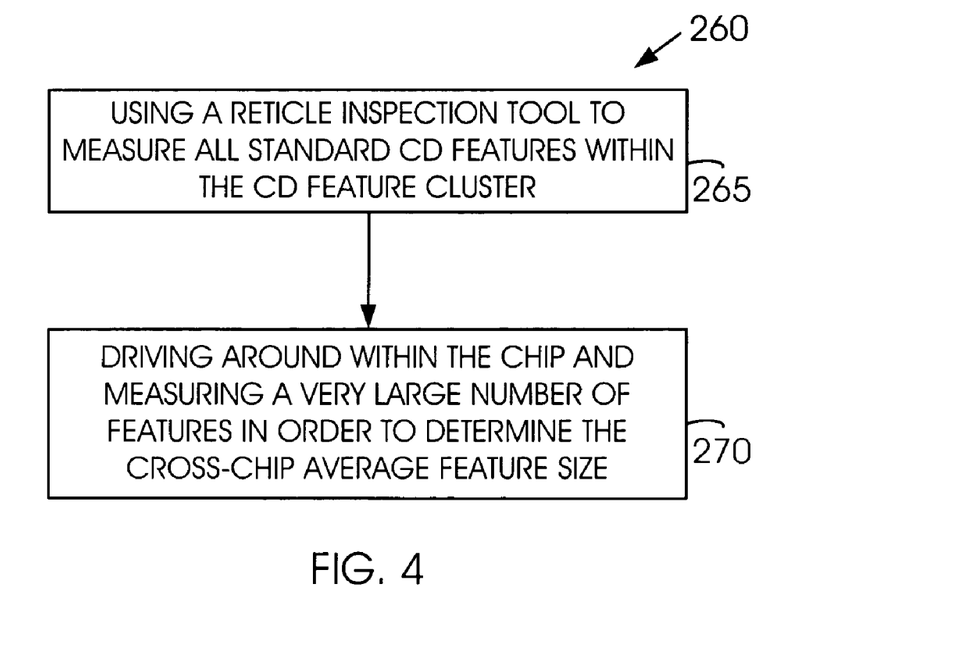
FIG. 4 is a flow chart illustrating a second method of determining a cross-chip average feature size in accordance with an embodiment of the invention.

The second step 110 of method 100 can also be performed using the method 260 illustrated in FIG. 4. Method 260 begins with the first step 265, which is to use a reticle inspection tool to measure all standard CD features 205, 210, 215, 220, 225 within the CD feature cluster 200. The second step 270 of the method 260 is to drive around within the chip and measure a very large number of features in order to determine the cross-chip average feature size. The method 260 avoids tying up a production tool, and also bypasses errors associated with the lithography and etch processes. Nevertheless, the method 260 still requires a significant period of time to perform on the reticle inspection tool.

Figure 5:
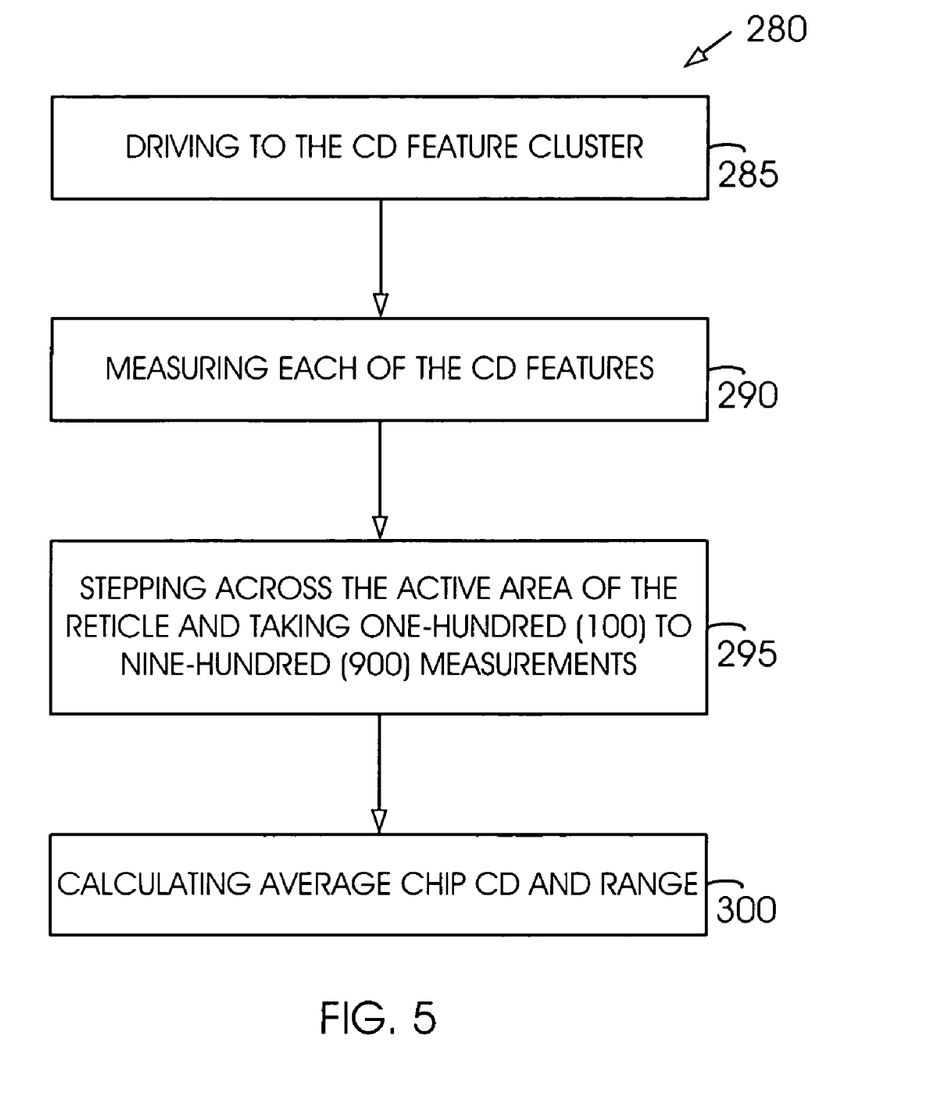
FIG. 5 is a flow chart illustrating a third method of determining a cross-chip average feature size in accordance with an embodiment of the invention.

Current industry standard methodologies require human time to operate the metrology tool and select features to measure. This cycle time problem is addressed by the method 280 for performing the second step 110 of method 100 which utilizes an automated sampling routine for the reticle inspection tool. The method 280 is illustrated in FIG. 5 and is the preferred over methods 240, 260 for performing the second step 110 of the method 100. In the first step 285 of the method 280, with minimal operator input, a program drives to the CD feature cluster 200. In the second step 290 of the method 280, the program measures each of the CD features 205, 210, 215, 220, 225. In the third step 295 of the method 280, the program steps across the active area of the reticle and taking one-hundred (100) to nine-hundred (900) measurements. In the fourth step 300 of the method 280, the program calculates average chip CD and range.

Once the cross-chip average feature size is determined from one of the third step 255 of method 240, the second step 270 of method 260, or the fourth step 300 of method 280, the third step 115 of method 100 is performed. The third step 115 of method 100 is to select the CD feature 205, 210, 215, 220, 225 which is closest in size to the cross-chip average CD feature size as the standard feature for in-line measurement. For example, if the standard CD features are all printed correctly, i.e., at the drawn size of two-hundred (200) nanometers, on the mask, but the cross-chip average CD size determined in the second step 110 of the method 100 turned out to be one-hundred ninety (190) nanometers due to mask writing errors, then CD feature 205 could be selected as the standard CD monitor feature. With exposure dose adjusted to print CD feature 205 at the two-hundred (200) nanometers target on a wafer, the cross-chip average feature size would also end up as two-hundred (200) nanometers on the wafer. Conversely, if the cross-chip average CD size determined in the second step 110 of the method 100 were right at the two-hundred (200) nanometers target on the mask, but the features in the CD cluster 200 are printed ten (10) nanometers below drawn size on the mask, so that mask-writing errors cause CD feature 215 to be one-hundred ninety (190) nanometers on the mask and CD feature 225 is at two-hundred (200) nanometers on the mask, then CD feature 225 could be selected as the standard CD monitor feature. Again, adjusting dose to print CD feature 225 at two-hundred (200) nanometers on a wafer would result in the cross-chip average feature size also being printed at the target size on the wafer.

It should be noted that mask writing errors vary slowly with position, so that all standard CD features in a CD feature cluster will generally experience identical mask writing errors. Therefore, as long as suitable feature size increments and total feature size range are selected for the CD feature cluster, there should always be a feature within the CD feature cluster that is printed on the mask very close to the cross-chip average CD size, whatever that average might be and despite any mask-writing error which might affect the CD feature cluster.

Once the third step 115 of the method 100 has been performed such that the CD feature cluster 200 is on the mask and the appropriate feature for measurement within the CD feature cluster 200 has been identified, the fourth step 120 of the method 100 is to implement the CD measurement of the appropriate feature on production wafers. The fourth step 120 of the method 100 requires only a minimal information transfer between the personnel operating the reticle inspection tool and the personnel performing in-line CD measurements on production wafers, i.e., which CD feature 205, 210, 215, 220, 225 to use. The use of clear and unique labels for each feature 205, 210, 215, 220, 225 within the CD feature cluster 200 make it easy for the metrology personnel to select the appropriate feature when setting up the automated metrology job. The labels also make pattern recognition easy for the metrology tool, so that during automated measurements there is no risk of the metrology tool accidentally jumping to measure the wrong feature. The net result is that the method 100 assures that in-line CD size measurements are efficient, accurate, and representative of the cross-chip average CD size. This yields in-line CD measurements which translate directly to end-of-line electrical parameters.

Figures 6A, 6B:
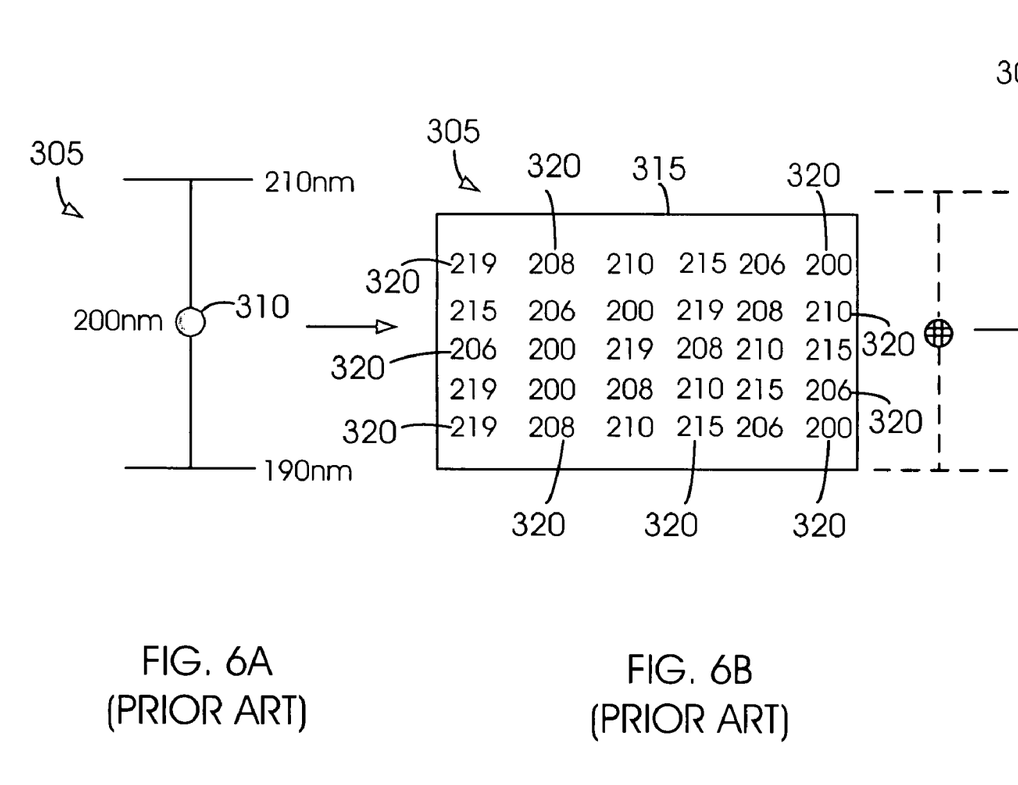
FIGS. 6A–6C illustrate a prior art method of making in-line measurements of feature sizes across an entire chip.
Figure 6C:
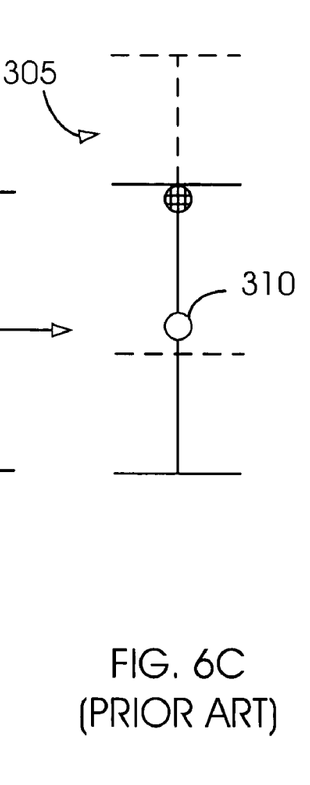

The method 100 further results in the additional benefit of increased tolerance for targeting. Industry standards require the mask vendor to maintain a specified uniformity across the reticle. Traditionally, a specification requires all features on a reticle to be within +/− ten (10) nanometers (this is an arbitrary number for purposes of example) of the drawn target CD. Any feature that is outside the specified tolerance will result in failed electrical testing. The traditional method 305 is illustrated in FIGS. 6A–6C. FIG. 6A illustrates that all CD features must fall within +/− ten (10) nanometers of the two-hundred (200) nanometer target 310. FIG. 6B illustrates a reticle 315 which is purchased from a vendor. The CD features 320 on the reticle 315 have a range of nineteen (19) nanometers, an average of two-hundred nine (209) nanometers, and a max CD feature of two-hundred nineteen (219) nanometers. Thus, FIG. 6C illustrates that the reticle 315 is rejected because nearly half of the CD features 320 on the reticle 315 fall outside the specified tolerance illustrated in FIG. 6A.

Figure 7A:
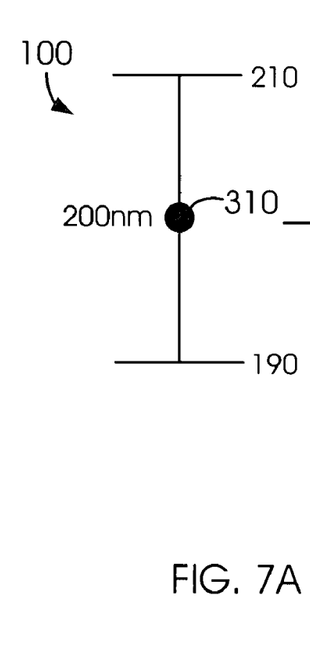
FIGS. 7A–7C illustrate the method of making in-line measurements of feature sizes across an entire chip in accordance with an embodiment of the invention.
Figure 7B:
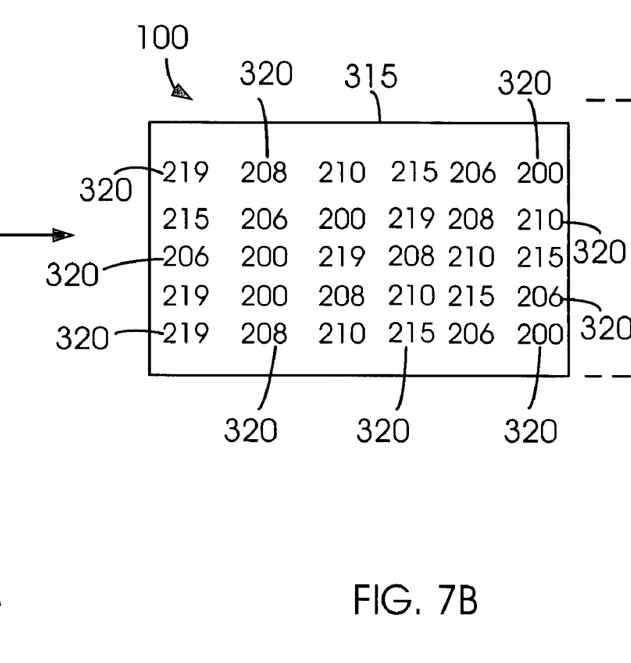
Figure 7C:
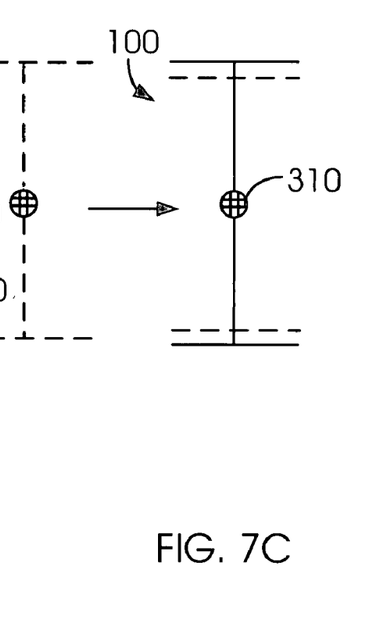

However, by providing a feature that represents the average CD across the reticle, lithography dose can be readily adjusted to hit the target CD. The method 100 requires that only the average CD on the reticle fall within the twenty (20) nanometer absolute tolerance. The method 100 is illustrated in FIGS. 7A–7C. FIG. 7A, which is identical to FIG. 6A, illustrates that all CD features must fall within +/− ten (10) nanometers of the two-hundred (200) nanometer target 310. FIG. 7B illustrates a reticle 315, which is identical to the reticle 315 illustrated in FIG. 6B, which is purchased from a vendor. The CD features 320 on the reticle 315 have a range of nineteen (19) nanometers, an average of two-hundred nine (209) nanometers, and a max CD feature of two-hundred nineteen (219) nanometers. Thus, FIG. 7C illustrates that the reticle 315 passes because one of the CD features 320 of two-hundred ten (210) nanometers is chosen such that dose is adjusted to print two-hundred ten (210) average as two-hundred (200) target. All printed CDS are thus within the specified tolerance illustrated in FIG. 7A. Thus, in the method 100, as illustrated in FIGS. 7A–7C, rather than all CD features 320, only the average CD feature on the reticle 315 must fall within the traditional specification tolerance to pass electrical testing. The method 100 potentially doubles the traditional reticle specification tolerance. Moreover, the method 100 results in cost savings and improved cycle time for wafer production as fewer reticles 315 will be rejected for out of spec CDS.

While a preferred embodiment of the present invention is shown and described, it is envisioned that those skilled in the art may devise various modifications of the present invention without departing from the spirit and scope of the appended claims.

The invention is claimed as follows:

1. A method of making in-line critical dimension size measurements, said method including the steps of:
   a) incorporating a cluster of critical dimension features;
   b) determining a cross-chip average feature size of said critical dimension features of said cluster;
   c) selecting said critical dimension feature which is closest in size to said cross-chip average features size as a standard feature for in-line measurement; and
   d) implementing said critical dimension feature of said selected critical dimension feature on production wafers.

2. A method as defined in claim 1, wherein each of said critical dimension features in said cluster is clearly and uniquely labeled.

3. A method as defined in claim 1, wherein each of said critical dimension features in said cluster are identical to one another except for being specified in a photomask data file at a slightly different size.

4. A method as defined in claim 1, wherein each of said critical dimension features in said cluster are printed on a mask.

5. A method as defined in claim 1, wherein step (b) is performed by a method including the steps of:
   b1) printing a wafer using a mask;
   b2) measuring all said critical dimension features within said cluster; and
   b3) driving around within a chip and measuring a very large number of critical dimension features in order to determine said cross-chip average size.

6. A method as defined in claim 1, wherein step (b) is performed by a method including the steps of:
   b1) using a reticle inspection tool to measure all said critical dimension features within said cluster; and
   b2) driving around within a chip and measuring a very large number of critical dimension features in order to determine said cross-chip average size.

7. A method as defined in claim 1, wherein step (b) is performed by a method including the steps of:
   b1) driving to said cluster;
   b2) measuring each of said critical dimension features of said cluster;
   b3) stepping across an active area of a reticle and taking a plurality of measurements; and
   b4) calculating average chip critical dimension and range.

8. A method as defined in claim 7, wherein said plurality of measurements is at least one-hundred measurements.

9. A method as defined in claim 7, wherein said plurality of measurements is a maximum nine-hundred measurements.

10. A method as defined in claim 7, wherein said method for performing step (b) utilizes an automated sampling routine for a reticle inspection tool.

11. A method as defined in claim 1, wherein said cluster includes suitable critical dimension feature size increments and total critical dimension size range.

12. A method as defined in claim 1, wherein step (d) requires only a minimal information transfer between personnel operating a reticle inspection tool and personnel performing in-line critical dimension measurements on production wafers.

13. A method as defined in claim 1, wherein said method provides for increased tolerance for targeting.

* * * * *